United States Patent
Heitmann et al.

(10) Patent No.: US 6,559,696 B1
(45) Date of Patent: May 6, 2003

(54) CIRCUIT ARRANGEMENT FOR GENERATING A CLOCK-PULSE SIGNAL HAVING A FREQUENCY SYNCHRONOUS WITH A REFERENCE CLOCK-PULSE SIGNAL

(75) Inventors: Juergen Heitmann, Neuried (DE); Eduard Zwack, Puchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/089,180

(22) PCT Filed: Sep. 15, 2000

(86) PCT No.: PCT/DE00/03219

§ 371 (c)(1),
(2), (4) Date: Mar. 27, 2002

(87) PCT Pub. No.: WO01/24371

PCT Pub. Date: Apr. 5, 2001

(30) Foreign Application Priority Data

Sep. 28, 1999 (DE) .......................................... 199 46 502

(51) Int. Cl.$^7$ ................................................ H03L 7/06
(52) U.S. Cl. ...................................... 327/156; 327/147
(58) Field of Search ................................ 327/146, 147, 327/154, 155, 163, 156; 331/25, DIG. 2; 375/373, 375, 376

(56) References Cited

U.S. PATENT DOCUMENTS

| | | | | | |
|---|---|---|---|---|---|
| 4,835,481 A | * | 5/1989 | Geissler et al. | ............. | 327/156 |
| 5,768,326 A | * | 6/1998 | Koshiro et al. | ............. | 375/376 |
| 5,950,115 A | | 9/1999 | Momtaz et al. | ............... | 455/73 |
| 6,356,158 B1 | * | 3/2002 | Lesea | .......................... | 331/11 |

FOREIGN PATENT DOCUMENTS

| EP | 0 262 481 A2 | 4/1988 |
|---|---|---|
| WO | WO 84/01069 | 3/1984 |

* cited by examiner

Primary Examiner—Timothy P. Callahan
Assistant Examiner—Linh Nguyen
(74) Attorney, Agent, or Firm—Morrison & Foerster, LLP

(57) ABSTRACT

To synchronize a controllable oscillator with a first reference clock signal, a first phase locked loop having a first phase comparison device is provided. In addition, the synchronous-frequency clock signal from the oscillator is supplied to a second phase comparison device for phase comparison with a second reference clock signal via an inventive phase control element for inserting and removing clock phases. On the basis of the output signal from the second phase comparison device, phase correction information is formed and on the basis of this phase correction information the insertion and removal of clock phases is controlled in the phase control element. If the first reference clock signal disappears, the oscillator is stabilized using the second reference clock signal by taking into account the phase correction information formed previously.

12 Claims, 1 Drawing Sheet

CIRCUIT ARRANGEMENT FOR GENERATING A CLOCK-PULSE SIGNAL HAVING A FREQUENCY SYNCHRONOUS WITH A REFERENCE CLOCK-PULSE SIGNAL

CLAIM FOR PRIORITY

This application claims priority to International Application No. PCT/DE00/03219 which was published in the German language on Sept. 15, 2000.

TECHINCAL FIELD OF INVENTION

The invention relates to a circuit having a clock signal with a frequency synchronous with a reference clock signal.

BACKGROUND OF THE INVENTION

In digital communications systems, individual communications system components require an accurate system clock for synchronizing interchange of communications data. Normally, highly accurate reference clock signals are supplied to individual communications system components for this purpose, e.g. via the public network. Generally, the reference clock signals supplied do not directly provide clock control for a communications system component, but rather are routed to a phase locked loop in which system clock signals are formed and transmitted to individual assemblies.

Since interference-free transmission of an external reference clock signal cannot be guaranteed at all times, a communications system component is often provided with a dedicated highly stable reference clock source which, in the event of the external reference clock signal disappearing, is used to stabilize the clock generator via a second phase locked loop.

Such a circuit arrangement is known from European patent application 0 262 481, for example. This circuit arrangement contains a reference reception part which receives the external reference clock signals and is connected to a first input of a first phase comparison device. The output of the first phase comparison device is routed via an integration device and a filter whose output can be connected to a downstream voltage controlled oscillator using a switching element. The synchronous-frequency clock signals formed in the voltage controlled oscillator are routed from the latter's output both to an output of the circuit arrangement and to a second input of the first phase comparison device.

The known circuit arrangement also contains a highly stable reference clock source whose output is connected to a first input of a second phase comparison device. The second input of this second phase comparison device is likewise connected to the output of the voltage controlled oscillator. The output of the second phase comparison device can be connected either to an additional filter or to a minuend input of a subtraction element using a further switching element. The output of the subtraction element, to whose subtrahend input the output of the additional filter is connected, is connected to another input of the switching element via a further filter.

The known circuit arrangement thus contains two phase locked loops, the first phase locked loop being controlled by the external reference clock signals, and the second phase locked loop being controlled by the reference clock signals from the highly stable reference clock source. Normally, the voltage controlled oscillator is synchronized with the supplied external reference clock signals. If the external reference clock signals disappear or if prescribed phase differences are exceeded, there is a switch to the highly stable reference clock source. In the additional filter, during synchronization by the external reference clock signals, the discrepancies between the synchronous-frequency clock signals and the reference clock signals from the highly stable reference clock source are gathered and correction adjustment information is formed. After switching to the highly stable reference clock source, the subtraction element is used to include this correction adjustment information in the formation of adjustment information for the voltage controlled oscillator.

However, this circuit arrangement has the problem that, to avoid an excessively long regulation delay, the frequency of the highly stable reference clock source should be comparatively high. A high clock frequency also results in a comparatively high current consumption, however, which means that such a circuit arrangement is not very suitable for battery operation. In addition, such a circuit arrangement is provided with switching means in order to detect cyclically occurring phase overflows in the second phase comparison device. In this context, phase overflow denotes when a phase difference of 360 degrees is exceeded. Such phase overflows occur cyclically if the frequency of the reference clock source and the frequency of the voltage controlled oscillator, synchronized with the external reference clock signal, differ from one another systematically, possibly after they have each passed through a frequency divider.

SUMMARY OF THE INVENTION

In one embodiment of the invention, there is a circuit arrangement for producing a clock signal whose frequency is synchronous with that of reference clock signals which has an improved regulation characteristic, in particular when a reference clock signal having a comparatively low clock frequency is supplied.

The circuit arrangement includes, for example, an oscillator whose clock frequency, in a first operating mode of the circuit arrangement, synchronized with a supplied, first reference clock signal using a first phase locked loop which comprises a first phase comparison device. In addition, a phase control element and a second phase comparison device are provided which are used in the first operating mode to detect a discrepancy between a supplied, second reference clock signal and the synchronous-frequency clock signal from the oscillator and to form phase correction information. In a second operating mode of the circuit arrangement, e.g. if the first reference clock signal disappears, the oscillator is no longer synchronized using the first reference clock signal, but rather using the second reference clock signal. Such a second operating mode is often also referred to as "hold-over mode". In this case, the phase correction information formed in the first operating mode is brought into the phase control. This is done by virtue of a phase control element inserting or removing clock phases in the clock signal from the oscillator on the basis of the phase correction information before phase comparison with the second reference clock signal.

Correction of the oscillator phase or oscillator frequency before phase comparison with the second reference clock signal makes it easy to prevent cyclically occurring phase overflows during phase comparison when there is a systematic discrepancy between the oscillator clock signal, whose frequency is synchronous with that of the first reference clock signal, and the second reference clock signal.

One advantage of the circuit arrangement provides very good regulation characteristic and short regulation time constants which are ensured, in particular, even for a comparatively low-frequency second reference clock signal. The production of low-frequency reference clock signals generally requires less power than the production of higher-frequency reference clock signals, which means that the circuit arrangement in conjunction with a low-frequency reference clock generator is also well suited to battery operation. The good regulation characteristic is a consequence of the phase correction by the phase control element being applied to the clock signal from the oscillator. Since the clock signal from the oscillator normally has a much higher frequency than the second reference clock signal, removal or insertion of individual clock phases in the clock signal from the oscillator makes it possible to control the frequency of this clock signal very precisely before phase comparison. In particular, this causes only very low phase and pulse jitter.

Another advantage of the inventive circuit arrangement is that no processor is required for implementing it. Instead, the circuit arrangement can be implemented using an inexpensive ASIC chip (Application Specific Integrated Circuit), for example.

In one aspct of the invention, the output of the first phase comparison device can be connected to the frequency control input of the oscillator via a switching element, such as a transistor, a logic gate or a multiplex device. This switching element can be actuated such that it is on in the first operating mode of the circuit arrangement and is off in the second operating mode.

Connected upstream of the frequency control input of the oscillator there may also be a filter, such as a simple low-pass filter or a "P, PI or PID filter", for integrating frequency control signals supplied to the oscillator. The frequency control input of the oscillator may often also perform such a filter function itself.

In addition, a memory can be provided which keeps the phase correction information formed in the first operating mode stored in it for as long as the circuit arrangement is in the second operating mode. In the second operating mode, the insertion and removal of clock phases is then controlled in the phase control element on the basis of the stored phase correction information.

To be able to compare two different clock signals using a phase comparison device, it is generally necessary for the clock signals which are to be compared to have the same nominal frequency. To compare clock signals having different nominal frequencies, these clock signals can respectively be supplied to the phase comparison device via a frequency divider. In this case, the division factor of a respective frequency divider is proportioned such that the divided nominal frequencies applied to the inputs of the phase comparison device are the same.

In accordance with one advantageous embodiment of the invention, a detector device can be provided which can be used to identify whether the first reference clock signal is present. An output of the detector device can be connected to one or more switching elements for controlling and/or changing over the operating mode.

In accordance with another advantageous embodiment of the invention, the regulating device can have an up/down counter whose counting direction is dependent on the output signal from the second phase comparison device. The up/down counter can be actuated, by way of example, such that its counter reading is either incremented or decremented at prescribed times, e.g. in each case on the positive or negative edges of the second reference clock signal, depending on whether the phase difference established is positive or negative. If the phases are equal, the counter reading can remain the same.

In addition, a phase control element controller having a counting register can be provided, the counting register being able to be loaded with the counter reading from the up/down counter as a counting preset. In this context, the counting register can be advanced starting from the counting preset, for example with timing prescribed by a clock signal, in order to prompt insertion or removal of a clock phase in the phase control element when a prescribed counting marker is reached.

In addition, the counting register can be split into a first register part for more significant bits and a second register part for less significant bits, with a counting frequency used to advance the second register part being determined by the content of the first register part. This functional isolation of the register parts allows a very wide control range to be achieved even when the length of the counting register or of the up/down counter is short. In this context, regulation is more accurate the lower the value of the more significant bits of the counting preset which determine the counting frequency, i.e. the less the clock signals which are to be compared by the second phase comparison device differ from one another.

In accordance with another advantageous embodiment of the invention, another phase control element, controlled by the regulating device, for deriving a further synchronous-frequency clock signal from the second reference clock signal can be provided. This allows a synchronous-frequency clock signal to be provided for a meter application, for example.

BRIEF DESCRIPTION OF THE DRAWINGS

An exemplary embodiment of the invention is explained in more detail below with reference to the drawings, in which.

DETAILED DESCRIPTION OF THE PREFFERED EMBODIMENT

Figure 1:
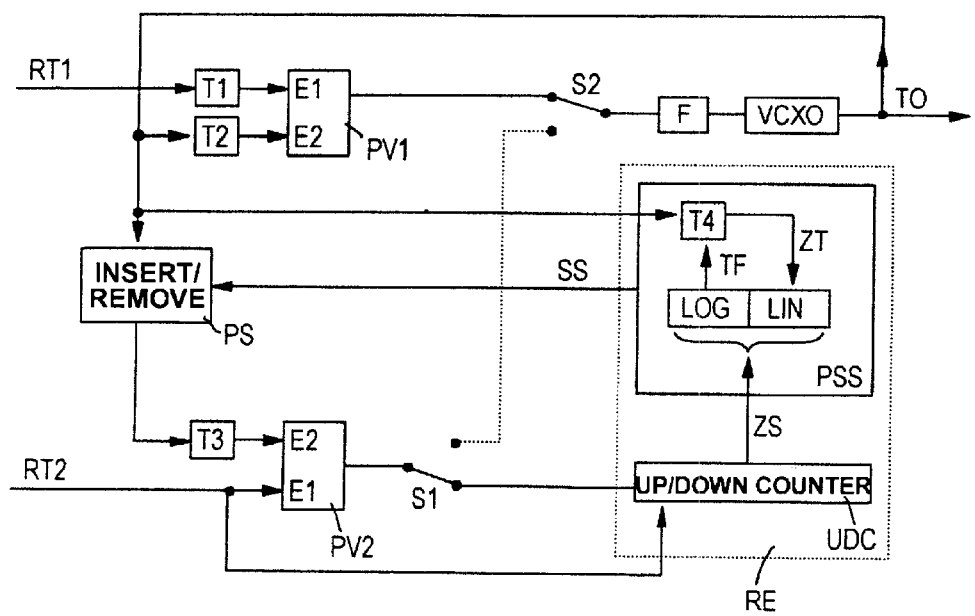
FIG. 1 shows a schematic illustration of an inventive circuit arrangement.

FIG. 1 shows a schematic illustration of a circuit arrangement for producing a clock signal T0 whose frequency is synchronous with that of the supplied reference clock signals RT1 and RT2. The circuit arrangement has a first phase locked loop which comprises a first phase comparison device PV1, a filter F and a voltage controlled oscillator, a so-called VCXO (Voltage Controlled X-tal Oscillator). In a first operating mode of the circuit arrangement, the output of the phase comparison device PV1 is connected to a filter F via a switching element S2 and, via said filter F, to a frequency control input of the oscillator VCXO, which forms the clock signal T0 to be synchronized. The filter F is used for integrating frequency control signals supplied to the oscillator VCXO and, by way of example, can be in the form of a low-pass filter or a "P, PI or PID filter".

In the first operating mode, the clock signal T0 is synchronized with the first reference clock signal RT1. For the purposes of synchronizing communications devices, such a first reference clock signal RT1 is often derived from network clock signals, from signals transmitted by the public communications network or from signals received wirelessly from a time information transmitter. The first reference clock signal RT1 is supplied to a first input E1 of the first phase comparison device PV1 via a frequency divider T1. Likewise, the clock signal T0 from the oscillator VCXO is supplied to a second input E2 of the first phase comparison device PV1 via a frequency divider T2. In this case, the division factors of the frequency dividers T1 and T2 are proportioned such that the respectively divided nominal frequencies of the clock signal T0 and of the first reference clock signal RT1 are the same in each case.

Additional components in the circuit arrangement may include, for example, a phase control element PS for inserting and removing clock phases in the clock signal T0, a second phase comparison device PV2 and a regulating device RE. In the first operating mode of the circuit arrangement, the components are used to record any discrepancy between the clock signal T0 whose frequency is synchronous with that of the first reference clock signal RT1 and the second reference clock signal RT2. To this end, the second reference clock signal RT2 is supplied to a first input E1 of the second phase comparison device PV2. In this case, the second reference clock signal RT2 can be produced, by way of example, by a temperature compensated oscillator, a so-called tcxo (Temperature Compensated X-tal Oscillator). For the present exemplary embodiment, it may be assumed that the second reference clock signal RT2 has a typical application frequency of 32 768 Hz. The use of such a comparatively low frequency has the advantage that the second reference clock signal RT2 can be produced using commercially available tcxos which have a current consumption of a few microamps. This means that the inventive circuit arrangement in conjunction with a comparatively low-frequency TCXO as the second reference clock source is also well suited to battery operation.

For the purposes of phase comparison with the second reference clock signal RT2, the clock signal T0 from the oscillator VCXO is supplied to a second input E2 of the second phase comparison device PV2 via the phase control element PS and a frequency divider T3 in order to match the oscillator's nominal frequency to the frequency of the reference clock signal RT2. At a typical oscillator nominal frequency of 16 384 MHz, for example, a frequency divider T3 having a division factor of 500 needs to be provided for the purposes of matching to the frequency of 32 768 Hz of the second reference clock signal RT2. Such a high oscillator frequency allows particularly precise regulation as a result of the insertion and removal of clock phases.

In the first operating mode, the output signal from the second phase comparison device PV2 is supplied to an up/down counter UDC in the regulating device RE via a switching element S1 and determines the counting direction of said counter. The counting frequency of the up/down counter UDC is prescribed by the second reference clock signal RT2, which is likewise supplied to said counter. By way of example, the up/down counter UDC can be incremented whenever a phase edge of the second reference clock signal RT2 leads the corresponding phase edge of the divided clock signal T0, and can be decremented accordingly whenever it lags. The up/down counter UDC is stopped if the phases are approximately equal. In this context, phases can be regarded as being approximately equal if the respective phase difference measured is within a prescribed interval. A respective counter reading ZS on the up/down counter UDC represents accumulated phase correction information which describes a discrepancy between the clock signal T0 whose frequency is synchronized with that of the first reference clock signal RT1 and the second reference clock signal RT2, and hence describes the discrepancy between the first and second reference clock signals.

In addition, the regulating device RE comprises a phase control element controller PSS having a counting register which is split into a first register part LOG for more significant bits and a second register part LIN for less significant bits. The phase control element controller PSS also contains a frequency divider T4 to which the clock signal T0 from the oscillator VCXO is supplied before it passes through the phase control element PS. The division factor TF of the frequency divider T4 is determined by the content of the register part LOG of the counting register. The divided output frequency of the frequency divider T4 can thus be varied within wide limits, e.g. typically between 4 Hz and 4096 Hz. The clock signal T0 divided by the frequency divider T4 prescribes a counting clock signal ZT which is used to advance the register part LIN of the counting register.

To control the phase control element PS, the counter reading ZS on the up/down counter UDC is transferred as a counting preset to the counting register in the phase control element controller PSS. The more significant bits of the counter reading ZS which are transferred to the register part LOG thus stipulate a division factor TF for the present instant, while the less significant bits of the counter reading ZS which are transferred to the register part LIN prescribe a new start value for counting. After the counter reading ZS has been transferred, the register part LIN is advanced with the timing of the counting clock signal ZT up to a prescribed counting marker. When this counting marker is reached, the phase control element controller PSS forms a control signal SS which is supplied to the phase control element PS and at that point prompts removal or insertion of a clock phase in the clock signal T0 from the oscillator VCXO. On the basis of an arithmetic sign bit for the counter reading ZS, a decision is then made regarding whether a control signal for insertion or a control signal for removal of a clock phase is formed. In addition, when the prescribed counting marker is reached, the content of the counting register is renewed by subsequently loading a counter reading ZS for the present instant from the up/down counter UDC, and hence a renewed counting pass in the counting register is initiated.

In a second operating mode of the inventive circuit arrangement, to which mode there can automatically be a switch if the first reference clock signal RT1 disappears, for example, the clock signal T0 is synchronized using the second reference clock signal RT2, including the phase correction information ZS formed in the first operating mode. In this context, the synchronism with the first reference clock signal RT1, which is no longer used, should be maintained as accurately as possible.

A switch to the second operating mode is effected by changing over the switching elements S1 and S2. To this end, the switching element S1 is used to isolate the output of the second phase comparison device PV2 from the up/down counter UDC and instead to connect it to an input of the switching element S2 via a connection indicated by a dotted line. This input is coupled to the frequency control input of the oscillator VCXO via the filter F by changing over the switching element S2. Changing over the switching element S2 interrupts the previous connection between the output of the phase comparison device PV1 and the filter F. Changing over the switching elements S1 and S2 as described forms a second phase locked loop comprising the oscillator VCXO, the phase control element PS, the second phase comparison device PV2 and the filter F. The clock signal T0 is thus synchronized using the second reference clock signal RT2.

When the second phase comparison device PV2 has been isolated from the up/down counter UDC, the counter is stopped. In this case, its last counter reading ZS continues to be stored as phase correction information and is used, as in the first operating mode, for subsequent loading of the counting register in the phase control element controller PSS. The insertion and removal of clock phases is continued by the phase control element controller PSS. That is, as stipulated by the last counter reading ZS on the up/down counter UDC, which is constant in the second operating mode. This means that the phase control in the second phase locked loop is corrected by the last discrepancy established between the second reference clock signal RT2 and the first reference clock signal RT1, so that, with a high degree of accuracy, the clock signal T0 remains synchronous with the first reference clock signal RT1, which is no longer present.

Figure 2:
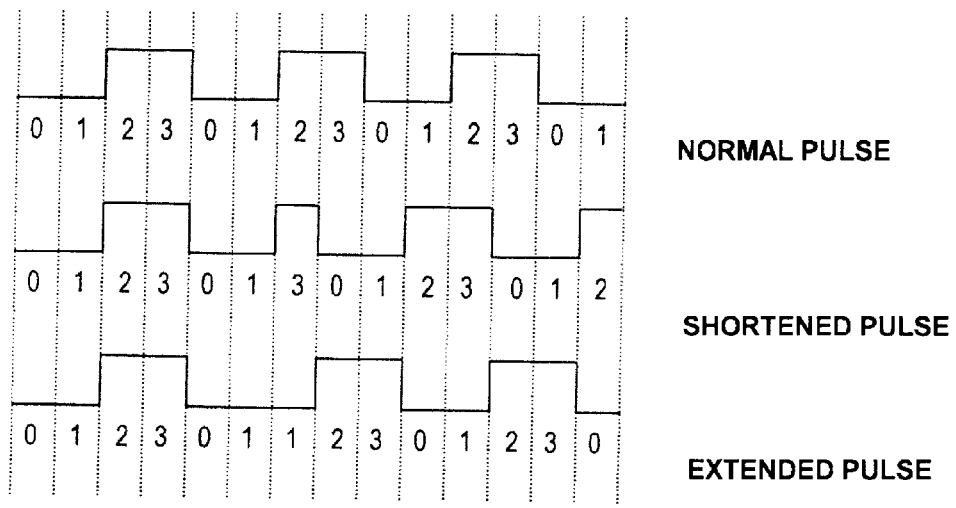
FIG. 2 shows a graphical illustration of phase relationships for clock signals.

FIG. 2 illustrates the change in the time profile of the clock signal T0 as a result of removal and insertion of clock phases by the phase control element. While the top curve shows the time profile for a clock signal which has not been changed by the phase control element PS, the middle curve shows a clock signal with a clock phase removed and the bottom curve shows a clock signal with a clock phase inserted.

In the present exemplary embodiment, the phase control element PS is produced in a particularly simple manner using a 2-bit counter. The counter runs through the counting steps 0,1,2 and 3 during one clock period of the clock signal T0. The output signal from the phase control element PS is derived from the state of the more significant bit of the 2-bit counter, i.e. the output signal is at zero during the counting steps 0 and 1 and is at one during the counting steps 2 and 3. The respective counting steps of the counter are indicated below the illustrated clock signal curves in each case.

A clock phase is now removed by skipping one counting step of the 2-bit counter when prompted by the control signal SS. This means that the phase of the subsequent clock pulses jumps forward by 90°. Similarly, a clock phase is inserted by suppressing a counting pulse which would otherwise cause the 2-bit counter to be advanced, the result of the suppression being that the 2-bit counter is not advanced again until the next counting pulse. This shifts the phase of subsequent clock pulses backward through 90°.

What is claimed is:

1. A circuit arrangement for producing a clock signal having a frequency synchronous with reference clock signals, comprising:
    an oscillator providing the synchronous-frequency clock signal and having a clock frequency controllable via a frequency control input;
    a first phase comparison device having a first input to couple a first reference clock signal, a second input, to which the clock signal from the oscillator is supplied, and an output which is routed to the frequency control input of the oscillator;
    a second phase comparison device having a first input to couple a second reference clock signal and an output configured for coupling to the frequency control input of the oscillator via a switching element on the basis of operating mode;
    a phase control element to insert and remove clock phases used to supply the clock signal from the oscillator to a second input of the second phase comparison device, with insertion and removal of clock phases controllable via a control input of the phase control element; and
    a regulating device configured for connection to the output of the second phase comparison device via a switching element on the basis of operating mode to form phase correction information on the basis of the second phase comparison device's output signal and which is connected to the control input of the phase control element to control insertion and removal of clock phases on the basis of the phase correction information.

2. The circuit arrangement as claimed in claim 1, wherein the output of the first phase comparison device is routed to the frequency control input of the oscillator via a switching element configured for connecting and isolating the output of the first phase comparison device and the frequency control input of the oscillator on the basis of operating mode.

3. The circuit arrangement as claimed in claim 1, further comprising:
    a filter connected upstream of the frequency control input of the oscillator to integrate frequency control signals supplied to the oscillator.

4. The circuit arrangement as claimed in claim 1, further comprising:
    a memory to store the phase correction information on the basis of operating mode.

5. The circuit arrangement as claimed in claim 1, wherein, a frequency divider is connected upstream of at least one input of at least one phase comparison device.

6. The circuit arrangement as claimed claim 1, wherein, an output of a detector device which indicates when the first reference clock signal is present is connected to a switching element to control the operating mode.

7. The circuit arrangement as claimed in claim 1, wherein an output of a detector device which indicates when the second reference clock signal is present is connected to an alarm transmitter to trigger an alarm signal when the second reference clock signal is not present.

8. The circuit arrangement as claimed in claim 1, wherein an output of a detector device which indicates when the clock signal from the oscillator is present is connected to an alarm transmitter to trigger an alarm signal when the clock signal is not present.

9. The circuit arrangement as claimed in claim 1, wherein, the regulating device has an up/down counter whose counting direction is dependent on the output signal from the second phase comparison device and whose counter reading represents the phase correction information.

10. The circuit arrangement as claimed in claim 9, wherein the regulating device has a phase control element controller having a counting register configured to load the counter reading from the up/down counter as a counting preset and prompts insertion or removal of a clock phase in the phase control element when a prescribed counting marker is reached.

11. The circuit arrangement as claimed in claim 10, wherein the counting register is split into a first register part for more significant bits and a second register part for less significant bits, and
    a counting frequency used to count through the second register part is determined by the content of the first register part.

12. The circuit arrangement as claimed in claim 1, further comprising:
    another phase control element, controlled by the regulating device, to derive another synchronous-frequency clock signal from the second reference clock signal.

* * * * *